US012660284B2

(12) United States Patent
Moriya

(10) Patent No.: US 12,660,284 B2
(45) Date of Patent: Jun. 16, 2026

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Tomohiro Moriya, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 255 days.

(21) Appl. No.: 18/359,241

(22) Filed: Jul. 26, 2023

(65) Prior Publication Data

US 2024/0096990 A1 Mar. 21, 2024

(30) Foreign Application Priority Data

Sep. 20, 2022 (JP) ................................. 2022-149610

(51) Int. Cl.
*H10D 64/27* (2025.01)
*H01L 21/02* (2006.01)
(Continued)

(52) U.S. Cl.
CPC ..... *H10D 64/517* (2025.01); *H01L 21/02178* (2013.01); *H01L 21/02244* (2013.01);
(Continued)

(58) Field of Classification Search
CPC .. H10D 64/517; H10D 62/8325; H10D 64/01; H10D 64/252; H10D 64/514;
(Continued)

(56) References Cited

U.S. PATENT DOCUMENTS

2012/0223338 A1* 9/2012 Mitani ................. H10D 62/151
257/77
2018/0190605 A1 7/2018 Hamaguchi et al.
(Continued)

FOREIGN PATENT DOCUMENTS

JP S63208225 A 8/1988
JP 2013016538 A 1/2013
(Continued)

OTHER PUBLICATIONS

Office Action issued for corresponding Japanese patent application No. 2022-149610, and its English translation, dated May 12, 2026.

*Primary Examiner* — Samuel A Gebremariam
(74) *Attorney, Agent, or Firm* — Rabin & Berdo, P.C.

(57) ABSTRACT

On a surface of a portion of a front electrode exposed in an opening of a passivation film, a Ni-deposited film having high solder wettability is provided apart from the sidewalls of the opening of the passivation film. Metal wiring is soldered to the Ni-deposited film. The solder layer is formed only on the Ni-deposited film and thus, the solder layer and the passivation film do not contact each other. The front electrode contains Al and an entire area of the surface of the front electrode excluding the portion where the Ni-deposited film is formed is covered by a surface oxide film that is constituted by an aluminum oxide film formed by intentionally oxidizing the surface of the front electrode. The surface oxide film intervenes between the front electrode, the passivation film, and a sealant, whereby the adhesive strength of the passivation film and the sealant is increased.

11 Claims, 10 Drawing Sheets

(51) Int. Cl.

| | |
|---|---|
| *H01L 21/285* | (2006.01) |
| *H01L 21/308* | (2006.01) |
| *H01L 21/56* | (2006.01) |
| *H10D 62/832* | (2025.01) |
| *H10D 64/01* | (2025.01) |
| *H10D 64/23* | (2025.01) |

(52) U.S. Cl.

CPC .... *H01L 21/28518* (2013.01); *H01L 21/3081* (2013.01); *H01L 21/56* (2013.01); *H10D 62/8325* (2025.01); *H10D 64/01* (2025.01); *H10D 64/252* (2025.01); *H10D 64/514* (2025.01)

(58) Field of Classification Search

CPC ......... H01L 21/02178; H01L 21/02244; H01L 21/28518; H01L 21/3081; H01L 21/56

See application file for complete search history.

(56) References Cited

U.S. PATENT DOCUMENTS

| | | | |
|---|---|---|---|
| 2019/0228974 | A1 | 7/2019 | Soneda et al. |
| 2020/0395314 | A1 | 12/2020 | Yoshida et al. |

FOREIGN PATENT DOCUMENTS

| | | | |
|---|---|---|---|
| JP | 6436247 | B2 | 12/2018 |
| JP | 6906681 | B2 | 7/2021 |
| JP | 2022031540 | A | 2/2022 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2022-149610, filed on Sep. 20, 2022, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

It is commonly known that in a semiconductor device in which metal wiring is soldered to a surface electrode (hereinafter, front electrode) at a front surface of a semiconductor substrate (semiconductor chip) when the semiconductor device is mounted to a semiconductor module, a plated film containing nickel (Ni), etc. having high solder wettability is formed on the front electrode, which contains aluminum (Al) as a material. A portion of the front electrode constituting an electrode pad is exposed in an opening of a passivation film and a plated film is formed in an entire area of the surface of the front electrode in the opening of the passivation film.

FIG. 19 is a cross-sectional view depicting a structure of a conventional semiconductor device. FIG. 19 is an enlarged view of a vicinity of a sidewall of an opening 104a of a passivation film 104. A conventional semiconductor device 110 depicted in FIG. 19 has, in the opening 104a of the passivation film 104, which is an uppermost surface protecting a front surface of a semiconductor substrate (semiconductor chip) 101, a plated film 103 on a front electrode 102, and a wiring structure are formed in which metal wiring (not depicted) is bonded to the plated film 103 via a solder layer 106 during mounting to a semiconductor module.

The front electrode 102 is an aluminum (Al) alloy layer having as a material, aluminum that contains silicon (AlSi). The plated film 103 is a stacked film in which a nickel (Ni) plated film and a gold (Au) plated film are sequentially stacked in order stated herein (in FIG. 19, indicated as "Ni/Au plating" and similarly in FIG. 20). The passivation film 104 is a surface protecting film containing a polyimide and provided as an uppermost surface above the front surface of the semiconductor substrate 101, the passivation film 104 covers and protects the front surface of the semiconductor substrate 101, the front electrode 102 on the front surface of the semiconductor substrate 101, and an insulating film (not depicted).

The front electrode 102 is exposed only in the opening 104a of the passivation film 104. Sidewalls of the opening 104a of the passivation film 104 are sloped in a direction toward the semiconductor substrate 101 so as to protrude toward the plated film 103. The plated film 103 is formed in an entire area of the front electrode 102 in the opening 104a of the passivation film 104. During soldering of the metal wiring, the solder wets and spreads on the plated film 103 to the sidewalls of the opening 104a of the passivation film 104 and thus, the solder layer 106 becomes embedded in a gap between the plated film 103 and the sidewalls of the opening 104a of the passivation film 104.

Accordingly, the passivation film 104, the plated film 103, and the solder layer 106 all contact one another at a single point (hereinafter, triple contact point) 111 on the surface of the front electrode 102. Stress is applied to the triple contact point 111 due to power cycling (intermittent energization) of the semiconductor device 110 and a crack 112 occurs in the front electrode 102 originating from the triple contact point 111, whereby the semiconductor device 110 may be destroyed. A device with increased power cycling capability achieved by eliminating the triple contact point 111 is one known conventional semiconductor device that prevents the occurrence of the crack 112.

FIG. 20 is a cross-sectional view depicting another example of a structure of a conventional semiconductor device. FIG. 20 depicts an enlarged view of a vicinity of sidewalls of openings 104a, 105a of passivation films 104, 105. FIG. 21 is a plan view depicting a state when the semiconductor substrate in FIG. 20 is viewed overall from a front side thereof. In FIG. 21, an outer periphery of the front electrode 102 is indicated by a dashed line. A conventional semiconductor device 120 depicted in FIGS. 20 and 21 differs from the conventional semiconductor device 110 depicted in FIG. 19 in that the passivation film 105 (indicated by hatching in FIG. 21) is provided so as to be embedded in a gap between the plated film 103 and sidewalls of the opening 104a of the passivation film 104.

In the fabrication (manufacturing) of the conventional semiconductor device 120 depicted in FIGS. 20 and 21, first, at the front side of the semiconductor substrate 101, a front device structure and the front electrode 102 are formed. Next, the passivation film 104 is formed in an entire area of the front surface of the semiconductor substrate 101 and thereafter, an opening is formed in the passivation film 104 thereby exposing the front electrode 102 below. Next, the plated film 103 is formed on the surface of the front electrode 102 by a plating treatment. The passivation film 104 is a mask for preventing wetting and spreading of the plated film 103.

Next, for example, by an inkjet method, the passivation film 105 is formed so as to be embedded in the gap between the plated film 103 and the sidewalls of the opening 104a of the passivation film 104. The plated film 103 is exposed by the opening 105a of the passivation film 105. Next, a heat treatment for hardening (curing) the passivation film 105 is performed. Next, metal wiring (not depicted) is bonded on the surface of the plated film 103, via the solder layer 106. The passivation film 105 is a mask for preventing wetting and spreading of the solder layer 106.

As for a conventional semiconductor device in which metal wiring is soldered, via a plated film, on a portion of a front electrode exposed in an opening of a passivation film, a device has been proposed in which sidewalls of the opening of the passivation film are sloped with respect to the surface of the front electrode, and the plated film is adhered to the sidewalls of the opening of the passivation film (for example, refer to Japanese Laid-Open Patent Publication No. 2013-016538 and Japanese Patent No. 6906681).

In Japanese Laid-Open Patent Publication No. 2013-016538, the passivation film extends toward the plated film in a direction away from the semiconductor substrate (direction to an uppermost surface) to eaves, whereby during soldering of the metal wiring, wetting and spreading of the solder to an interface between the passivation film and the plated film are suppressed and the solder is prevented from reaching the front electrode from the interface between the passivation film and the plated film.

In Japanese Patent No. 6906681, the passivation film protrudes toward the plated film in a direction toward the semiconductor substrate (downward) and from the surface of the front electrode, the plated film is formed on the sloped sidewalls of the opening of the passivation film, whereby adhesive strength of the passivation film is increased, and local corrosion of the front electrode and the plated film is suppressed.

Further, as for another conventional semiconductor device in which metal wiring is soldered, via a plated film, on a portion of a front electrode exposed in an opening of a passivation film, a device has been proposed in which the passivation film and the plated film are apart from each other, and stress due to deformation during sintering of passivation film is not transmitted to the plated film (for example, refer to Japanese Patent No. 6436247).

SUMMARY OF THE INVENTION

According to an embodiment of the present invention, a semiconductor device includes: a semiconductor substrate having a main surface; a device structure provided in the semiconductor substrate, at the main surface of the semiconductor substrate; an electrode layer containing aluminum, provided at the main surface of the semiconductor substrate, and electrically connected to the device structure; a protective film provided above the main surface of the semiconductor substrate as an uppermost layer of the semiconductor device, the protective film covering the electrode layer and having an opening at a center thereof; a metal film to which a metal wiring is soldered, the metal film being provided at a surface of the electrode layer within the opening of the protective film so as to be apart from sidewalls of the opening of the protective film in a plan view of the semiconductor device; and an aluminum oxide film provided at the surface of the electrode layer in an entire area of the electrode layer between the metal film and the sidewalls of the opening of the protective film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
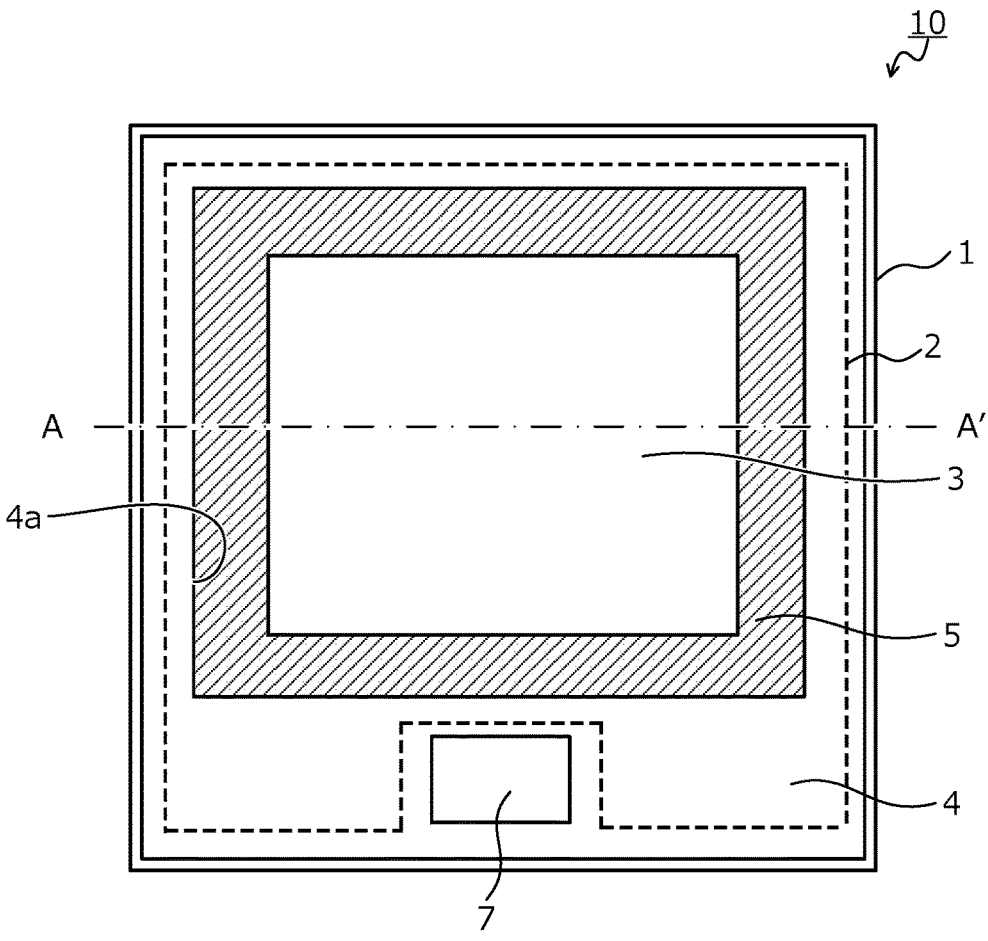
FIG. 1 is a plan view depicting a layout when a semiconductor device according to a first embodiment is viewed from a front side of a semiconductor substrate thereof.

First, problems associated with the conventional techniques are discussed. In the conventional semiconductor device 120 depicted in FIGS. 20 and 21 described above, to prevent cracking in the plated film 103, a curing temperature of the passivation film 105 formed after the formation of the plated film 103 is about 250 degrees C. or less and cannot be increased sufficiently, whereby adhesive strength of the passivation film 105 is low. When the passivation film 105 peels in the soldering of the metal wiring, the triple contact point 111 (refer to FIG. 19) of the passivation film 104, the plated film 103, and the solder layer 106 is formed and thus, the power cycling capability decreases.

Figure 21:
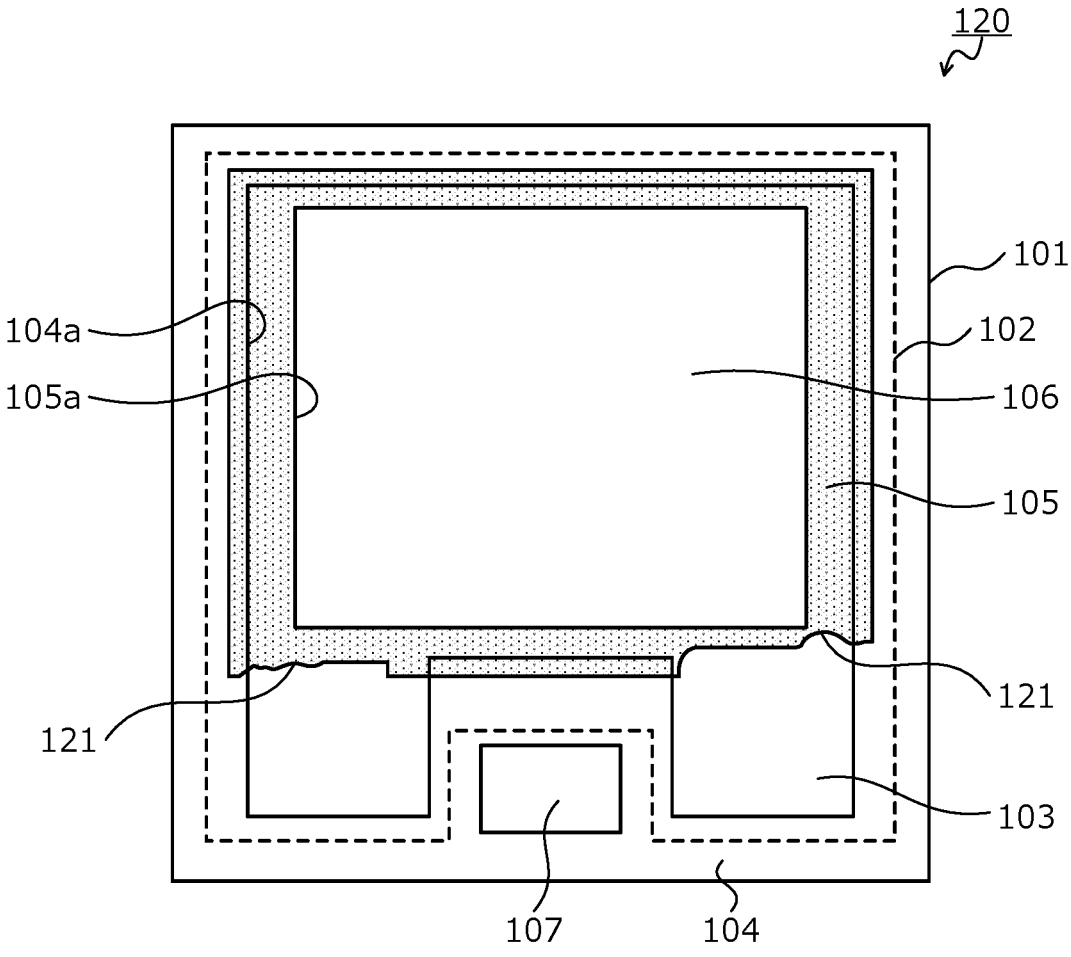
FIG. 21 is a plan view depicting a state when the semiconductor substrate in FIG. 20 is viewed overall from a front side thereof.

For example, an instance in which a side of the front electrode 102 is partially recessed inwardly (in a direction toward a center of the semiconductor substrate 101) in a substantially rectangular shape in a plan view of the device and a gate pad 107 is disposed in the recessed portion of the front electrode 102 is depicted in FIG. 21. The opening 104a of the passivation film 104 has a shape in the plan view of the device substantially similar to that of the front electrode 102 and substantially an entire area of the surface of the front electrode 102 is exposed. In the opening 104a of the passivation film 104, the plated film 103 is formed in an entire area of the front electrode 102 and the plated film 103 has a shape in the plan view of the device substantially similar to that of the front electrode 102.

The passivation film 105 is embedded in the gap between the plated film 103 and the sidewalls of the opening 104a of the passivation film 104 and the plated film 103 is exposed in the opening 105a. The inventor confirmed peeling 121 of the passivation film 105 in the soldering of the metal wiring due to the curing temperature of the passivation film 105 being low. At locations of the peeling 121 of the passivation film 105, wetting and spreading of the solder into the gap between the plated film 103 and the sidewalls of the opening 104a of the passivation film 104 occurred.

Embodiments of a semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical are given the same reference numerals and are not repeatedly described.

Figure 2:
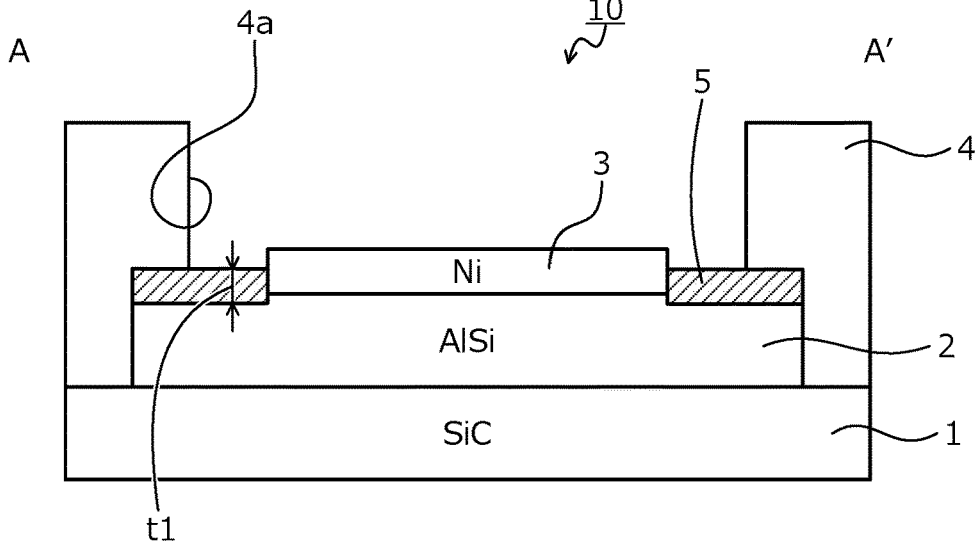
FIG. 2 is a cross-sectional view depicting a structure along cutting line A-A' in FIG. 1.
Figure 3:
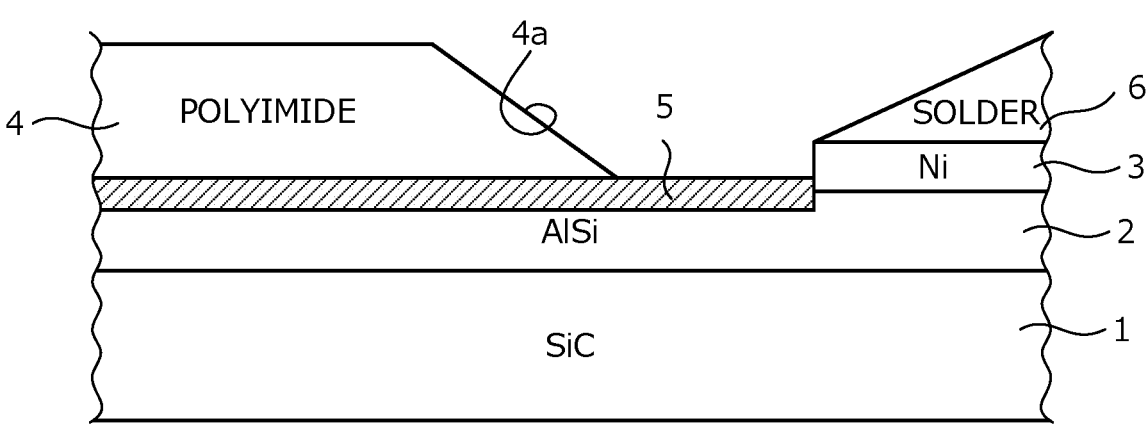
FIG. 3 is a cross-sectional view depicting an enlarged view of a vicinity of a sidewall of an opening of a passivation film in FIG. 2.

A structure of a semiconductor device according to a first embodiment is described. FIG. 1 is a plan view depicting a layout when the semiconductor device according to the first embodiment is viewed from a front side of a semiconductor substrate thereof. FIG. 2 is a cross-sectional view depicting the structure along cutting line A-A' in FIG. 1. In FIGS. 1 and 2, a solder layer 6 is not depicted. In FIG. 2, an outer periphery of a front electrode 2 is indicated by a dashed line. FIG. 3 is a cross-sectional view depicting an enlarged view of a vicinity of a sidewall of an opening of a passivation film in FIG. 2. FIG. 3 depicts a state in which metal wiring (not depicted) is bonded to a nickel (Ni)-deposited film 3 via the solder layer 6.

A semiconductor device 10 according to the first embodiment depicted in FIGS. 1 and 2 includes the Ni-deposited film (metal film: Ni film) 3 on a surface electrode (front electrode: electrode layer) 2 at a front surface of a semiconductor substrate (semiconductor chip) 1, and metal wiring (not depicted) is bonded to the Ni-deposited film 3 via the solder layer 6 (refer to FIG. 3) during mounting to a semiconductor module (or to a package that is a component to be mounted to a semiconductor module: not depicted). Herein, while the semiconductor substrate 1 contains silicon carbide (SiC) as a semiconductor material, without being limited hereto, for example, the semiconductor substrate 1 may contain silicon (Si) as a semiconductor material.

The front electrode 2 is formed (deposited) by, for example, sputtering aluminum (Al) as a material. The front electrode 2, is an Al alloy-deposited film containing, for example, aluminum that contains silicon (AlSi). The front electrode 2 is provided so as to occupy substantially an entire area of an active region and is electrically connected to a predetermined device structure (not depicted) in the semiconductor substrate 1, at the front surface thereof. The predetermined device structure is, for example, a metal oxide semiconductor (MOS) gate structure, which is an insulated gate with a metal-oxide film-semiconductor three-layer structure.

The active region is a region through which a main current flows when the semiconductor device 10 is in an on-state.

The active region, for example, has a substantially rectangular shape in a plan view of the semiconductor device 10 and is disposed in substantially a center of the semiconductor substrate 1. An edge termination region in which a predetermined voltage withstanding structure is disposed is between the active region and an end of the semiconductor substrate 1. The edge termination region is a region that surrounds a periphery of the active region and that has a function of mitigating electric field of the front side of the semiconductor substrate 1 and sustaining a breakdown voltage. The breakdown voltage is a voltage allowed as a range in which the semiconductor device 10 may be used without malfunction or destruction thereof.

A passivation film 4 containing a polyimide is provided as an uppermost surface above the front surface of the semiconductor substrate. The passivation film 4 is a surface protecting film that covers and protects the front surface of the semiconductor substrate 1, the front electrode 2, and an insulating film (not depicted). A portion of the front electrode 2 is exposed in the opening 4a of the passivation film 4. The portion of the front electrode 2 exposed in the opening 4a of the passivation film 4 functions as an electrode pad to which external connection metal wiring for pulling out the potential of the front electrode 2 to an external destination is soldered.

On the front electrode 2 in the opening 4a of the passivation film 4, the Ni-deposited film 3 is provided apart from the sidewalls of the opening 4a of the passivation film 4. The Ni-deposited film 3 is formed (deposited) by sputtering. Solder wettability of the surface of the front electrode 2 and solder joint performance are enhanced by the Ni-deposited film 3. Further, the Ni-deposited film 3 is disposed apart from the sidewalls of the opening 4a of the passivation film 4, whereby the solder layer 6 is formed only on the Ni-deposited film 3 and the solder layer 6 and the passivation film 4 are apart from (do not contact) each other.

Figure 19:
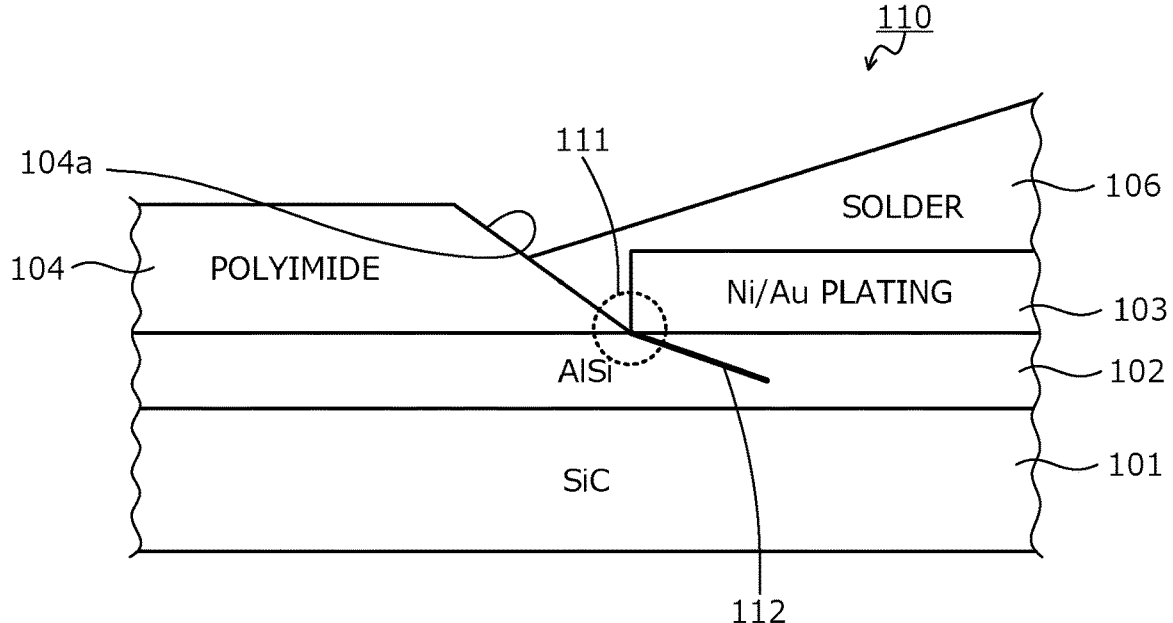
FIG. 19 is a cross-sectional view depicting a structure of a conventional semiconductor device.
Figure 20:
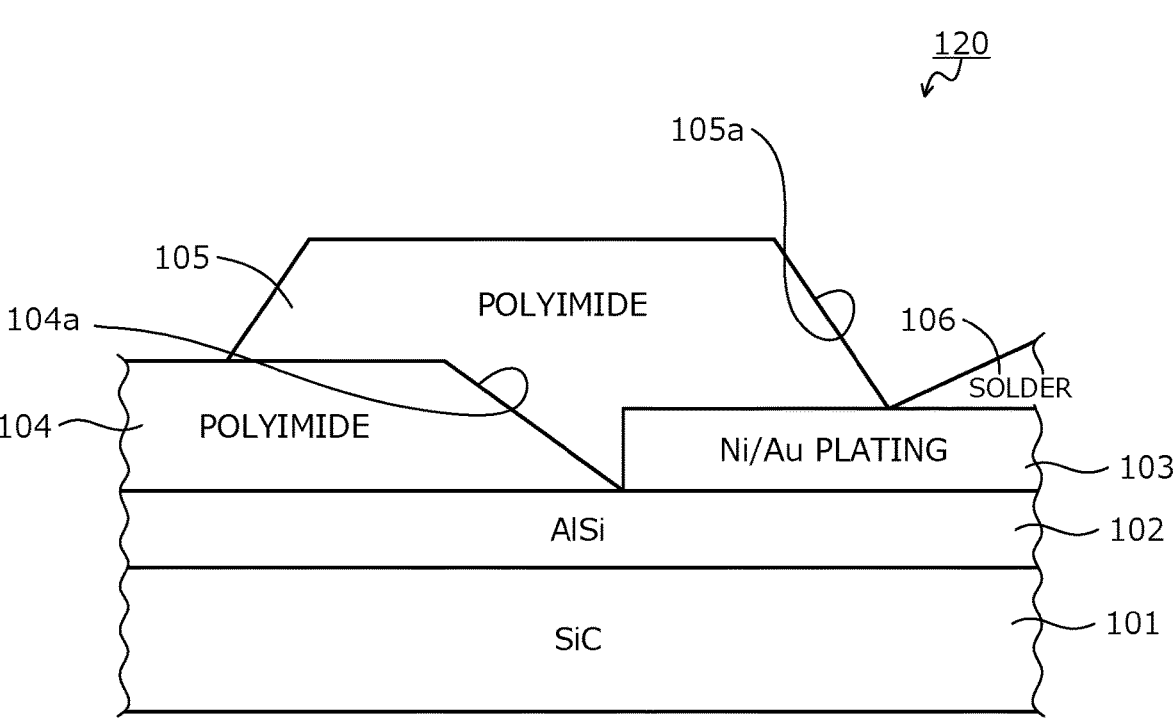
FIG. 20 is a cross-sectional view depicting another example of a structure of a conventional semiconductor device.

In other words, on the surface of the front electrode 2, a location where the passivation film 4, the Ni-deposited film 3, and the solder layer 6 all contact one another at a single point (corresponds to the triple contact point 111 of the conventional structure, refer to FIG. 19) is absent. Therefore, local concentration of stress at the front electrode 2 due to power cycling (intermittent energization) of the semiconductor device 10 may be suppressed. The sidewalls of the opening 4a of the passivation film 4 may be substantially orthogonal to the front surface of the semiconductor substrate 1 or may be sloped in a direction to the semiconductor substrate 1 so as to protrude toward the Ni-deposited film 3.

The Ni-deposited film 3 has a surface area that is smaller than that of the opening 4a of the passivation film 4 and a shape that is substantially the same as that of the opening 4a of the passivation film 4 (herein, for example, a rectangular shape) in the plan view of the semiconductor device 10. The metal wiring is bonded to the surface of the Ni-deposited film 3 via the solder layer 6. The solder layer 6 is formed only on the Ni-deposited film 3, in an entire are of the surface of the Ni-deposited film 3. Side surfaces of the solder layer 6, for example, in a direction to the passivation film 4, are sloped so as to protrude toward the passivation film 4. The metal wiring, for example, is copper (Cu) wiring of a lead-frame, etc.

Between the Ni-deposited film 3 and the sidewalls of the opening 4a of the passivation film 4, a surface oxide film 5 (hatched portion) is provided on the surface of the front electrode 2. The surface oxide film 5 is an aluminum oxide ($Al_2O_3$) film that is intentionally oxidized, i.e., that is different from a surface film that is a natural occurrence and formed on the surface of the front electrode 2, using a resist mask 13 (refer to FIG. 8) that is the same mask for forming the Ni-deposited film 3. The surface oxide film 5 has a thickness t1 that is greater than a thickness of an aluminum oxide film formed by natural oxidation of the front electrode 2 and is in a range of, for example, about 10 nm to 100 nm.

The surface oxide film 5 is in contact with the Ni-deposited film 3 and surrounds a periphery of the Ni-deposited film 3, along an outer periphery of the Ni-deposited film 3. The surface oxide film 5 extends to ends of the front electrode 2, between the front electrode 2 and the passivation film 4. The surface oxide film 5 covers an entire area of the surface of the front electrode 2, excluding a portion where the Ni-deposited film 3 is formed. In other words, the surface of the front electrode 2 is covered by the surface oxide film 5 and the Ni-deposited film 3 and thus, the surface of the front electrode 2 is not exposed. The solder layer 6 is not formed on the surface of the surface oxide film 5 (the surface of the surface oxide film 5 is free of the solder layer 6).

The surface oxide film 5 has a function of enhancing adhesiveness of the passivation film 4, sealant (not depicted), etc. Further, the surface oxide film 5 functions as a barrier film that prevents corrosion of the front electrode 2. The sealant fills a resin case of the semiconductor module to which the semiconductor substrate 1 is mounted, covers the front surface and side surfaces of the semiconductor substrate 1 entirely, and has a function of protecting the semiconductor substrate 1 from external factors (light, heat, moisture, dust, mechanical external forces, etc.). As a material of the sealant, for example, polyimide or the like is used.

Adhesiveness of the sealant, the passivation film 4 containing polyimide as a material, etc. with respect to the front electrode 2, which contains Al as a material is low. Further, a portion of the surface of the front electrode 2 not covered by the passivation film 4, another metal film (herein, the Ni-deposited film 3), etc. and thus, exposed, for example, corrodes under a high-humidity environment and the adhesiveness with respect to the sealant decreases. At locations where the passivation film 4 and/or the sealant peels, thermal stress concentrates due to power cycling of the semiconductor device 10 and the range of the peeling due to the power cycling of the semiconductor device 10 increases over time, whereby the lifespan of the semiconductor device 10 is shortened.

In the first embodiment, the surface oxide film 5, which is chemically stable, is formed on the surface of the front electrode 2. The adhesive strength of the passivation film 4 and the sealant is increased by the surface oxide film 5. Thus, peeling of the passivation film 4 and the sealant is suppressed, and power cycling capability may be enhanced. The power cycling capability is a degree of progression of fatigue and degradation (lifespan) of the semiconductor device 10 due to thermal stress generated by power cycling and varies depending on operating conditions and the operating environment of the semiconductor device 10.

Further, for example, in an instance in which the front electrode 2 corrodes, due to an accumulation of charge resulting from the process of corrosion of the front electrode 2, while electric field distribution of the front side of the semiconductor substrate 1 varies, in the first embodiment, even when the Ni-deposited film 3 is disposed apart from the sidewalls of the opening 4a of the passivation film 4, the front electrode 2 is not exposed due to the surface oxide film 5 and thus, corrosion of the front electrode 2 may be prevented. Accordingly, variation of the electric field distribution of the front side of the semiconductor substrate 1 from the design may be suppressed.

Figure 4:
FIG. 4 is a cross-sectional views depicting a state of the semiconductor device according to the first embodiment during manufacture.

A method of manufacturing the semiconductor device according to the first embodiment is described. FIGS. 4, 5, 6, 7, 8, 9, 10, and 11 are cross-sectional views depicting states of the semiconductor device according to the first embodiment during manufacture. First, as depicted in FIG. 4, at the front side of the semiconductor substrate 1 containing silicon carbide, a predetermined device structure (not depicted) is formed (first process). Next, in an entire area of the front surface of the semiconductor substrate 1, an Al-alloy-deposited film (electrode layer) 11 containing, for example, AlSi, and constituting the front electrode 2 is formed (second process).

Figure 5:
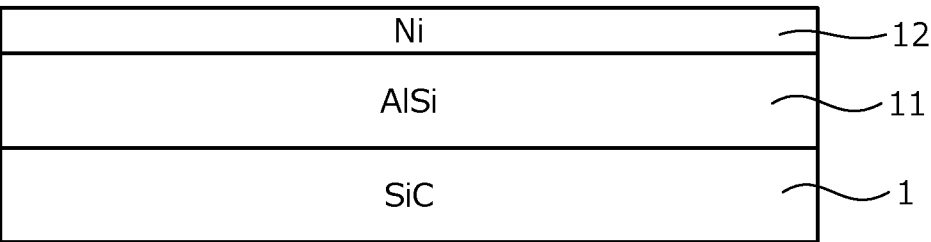
FIG. 5 is a cross-sectional views depicting a state of the semiconductor device according to the first embodiment during manufacture.

Next, as depicted in FIG. 5, an Ni-deposited film 12 is formed (deposited) by sputtering, in an entire area of the surface of the Al-alloy-deposited film 11 (fifth process). Furthermore, while a gold (Au)-deposited film may be formed at the surface of the Ni-deposited film 12 by sputtering, by forming an Au film (Au-deposited film) by sputtering, heavy metal contamination of the semiconductor substrate 1 may occur. Thus, preferably, the Au-deposited film may be formed by a method other than sputtering.

Figure 6:
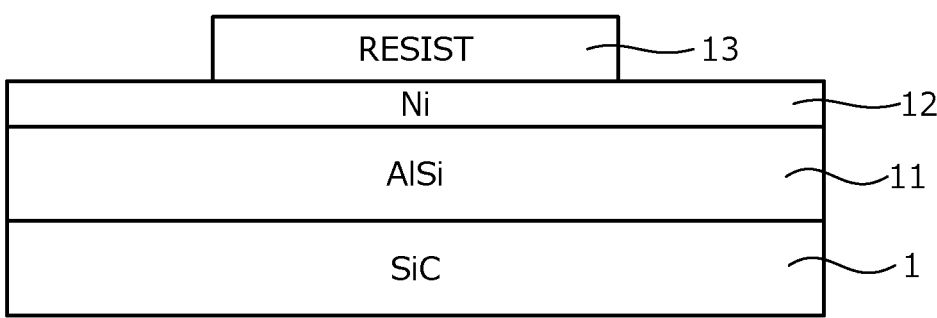
FIG. 6 is a cross-sectional views depicting a state of the semiconductor device according to the first embodiment during manufacture.
Figure 7:
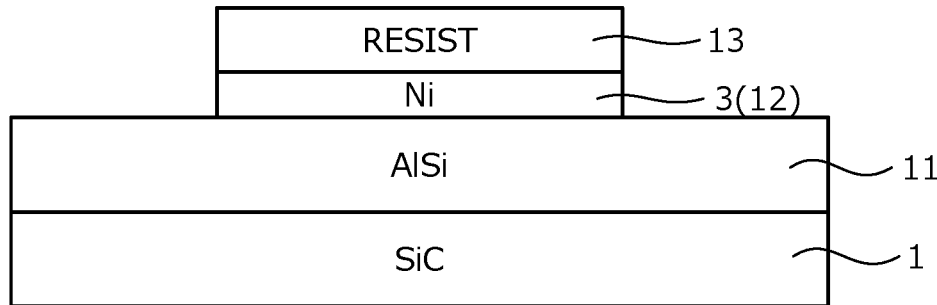
FIG. 7 is a cross-sectional views depicting a state of the semiconductor device according to the first embodiment during manufacture.

Next, as depicted in FIG. 6, the resist mask (resist film) 13 that covers a solder bonding region (first formation region) for the metal wiring is formed on the surface of the Ni-deposited film 12 (fifth process). Next, as depicted in FIG. 7, the Ni-deposited film 12 is selectively removed by etching, using the resist mask 13, whereby in a later-described module assembly process, the portion to which the metal wiring is soldered (i.e., the Ni-deposited film 3) is left and the Al-alloy-deposited film 11 is exposed so as to surround the periphery of the Ni-deposited film 3 (fifth process).

Figure 8:
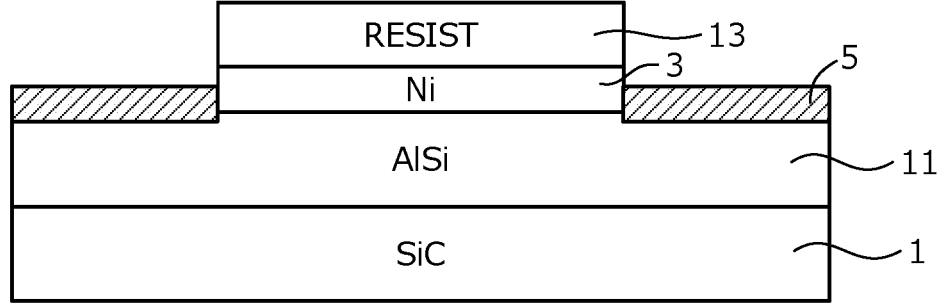
FIG. 8 is a cross-sectional views depicting a state of the semiconductor device according to the first embodiment during manufacture.
Figure 9:
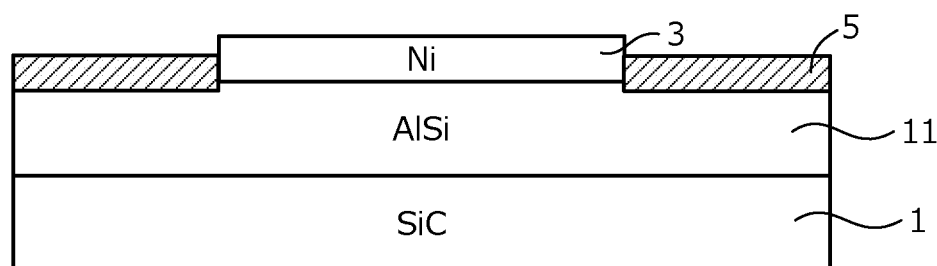
FIG. 9 is a cross-sectional views depicting a state of the semiconductor device according to the first embodiment during manufacture.

Next, as depicted in FIG. 8, the same resist mask 13 that is used to etch the Ni-deposited film 3 is used to oxidize the exposed surface of the Al-alloy-deposited film 11 by, for example, plasma oxidation or thermal oxidation under an oxygen ($O_2$) atmosphere and thereby form the surface oxide film 5 (sixth process). This oxidation treatment is performed at a temperature (for example, about 400 degrees C. or less, or preferably, about 300 degrees C. or less) that is less than the melting point of the material of the Al-alloy-deposited film 11. Subsequently, as depicted in FIG. 9, the resist mask 13 is removed (sixth process).

As described above, the same resist mask 13 that is used to etch the Ni-deposited film 3 is used to oxidize the exposed surface of the Al-alloy-deposited film 11 and thus, the surface oxide film 5 may be formed by self-alignment in an entire area of the surface of the Al-alloy-deposited film 11, excluding the portion where the Ni-deposited film 3 is left. As a result, the surface oxide film 5, which is in contact with the Ni-deposited film 3, surrounds the periphery of the Ni-deposited film 3 and reaches the ends of the front electrode 2 in an outward direction to the ends of the semiconductor substrate 1 is formed.

Figure 10:
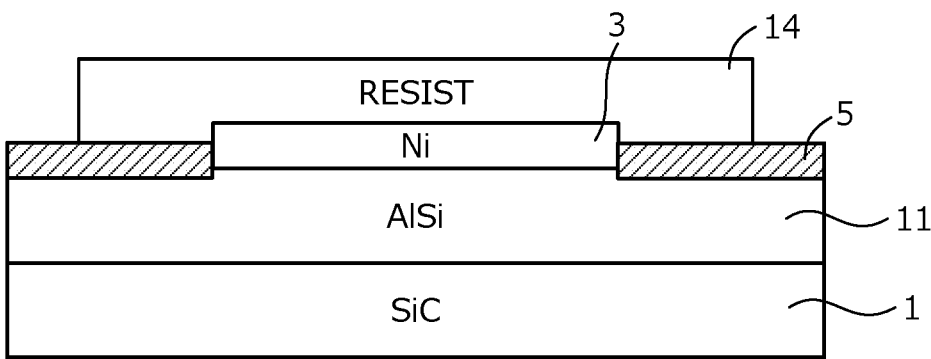
FIG. 10 is a cross-sectional views depicting a state of the semiconductor device according to the first embodiment during manufacture.
Figure 11:
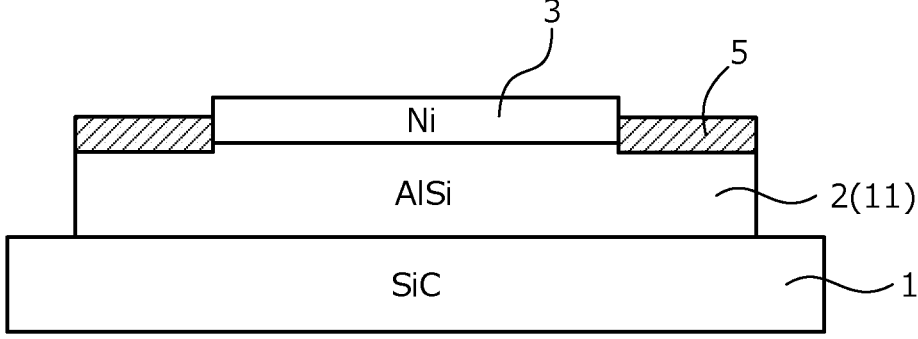
FIG. 11 is a cross-sectional views depicting a state of the semiconductor device according to the first embodiment during manufacture.

Next, as depicted in FIG. 10, a resist mask 14 that covers a formation region of the front electrode 2 is formed at the front surface of the semiconductor substrate 1. The resist mask 14 covers the Ni-deposited film 3 entirely. Next, as depicted in FIG. 11, the Al-alloy-deposited film 11 and the surface oxide film 5 are selectively removed (patterned) by etching using the resist mask 14 and only a portion of the Al-alloy-deposited film 11 constituting the front electrode 2 is left. The surface oxide film 5 is formed at the surface of the front electrode 2 in a region (second formation region) of the front electrode 2 that is the entire area of the surface of the front electrode 2 excluding the first formation region. Subsequently, the resist mask 14 is removed.

Next, the portion of the front electrode 2 constituting the electrode pad is exposed so that by a general method, the passivation film 4 is formed in an entire area of the front surface of the semiconductor substrate 1, the opening 4a is formed in the passivation film 4, and the Ni-deposited film 3 is disposed apart from the sidewalls of the opening 4a (third and fourth processes). An entire area of the surface of the front electrode 2, excluding the portion where the Ni-deposited film 3 is left, is covered by the surface oxide film 5 and thus, only the surface oxide film 5 between the Ni-deposited film 3 and the sidewalls of the opening 4a of the passivation film 4 is exposed.

Next, a heat treatment to harden (cure) the passivation film 4 is performed. Preferably, the curing temperature of the passivation film 4 may be a minimum temperature for curing the passivation film 4, for example, in a range of about 250 degrees C. to 300 degrees C. When the curing temperature of the passivation film 4 is less than or equal to the upper limit described above, the occurrence of cracking of the Ni-deposited film 3 due to thermal stress generated by the curing of the passivation film 4 may be prevented.

Further, to prevent the occurrence of cracking of the Ni-deposited film 3, even when the curing temperature of the passivation film 4 cannot be sufficiently raised to about the lower limit described above, the adhesive strength of the passivation film 4 is increased by the surface oxide film 5 of the front electrode 2. Therefore, peeling of the passivation film 4 may be suppressed. By the processes up to here, the semiconductor device 10 depicted in FIGS. 1 and 2 is completed.

Next, by a general module assembling process, the semiconductor substrate 1 (the semiconductor device 10) is mounted on a circuit board (not depicted) in the resin case, the metal wiring (not depicted) is soldered to the Ni-deposited film 3 on the front electrode 2 and the resin case is filled with a sealant, for example, a polyimide. During soldering of the metal wiring, the wetting and spreading of the solder stops on the Ni-deposited film 3 and is only on the Ni-deposited film 3, whereby the solder layer 6 is formed. As a result, semiconductor module depicted in FIG. 3 is completed.

As described above, the Ni-deposited film 3 is disposed apart from the sidewalls of the opening 4a of the passivation film 4. As a result, when the metal wiring is soldered to the front electrode 2, the wetting and spreading of the solder may be stopped on the Ni-deposited film 3. Further, even when the wetting and spreading of the solder spreads outward from the surface of the Ni-deposited film 3, the insulating film (the surface oxide film 5) is between the Ni-deposited film 3 and the sidewalls of the opening 4a of the passivation film 4 and thus, the solder layer 6 is formed only on the Ni-deposited film 3.

As described above, according to the first embodiment, on the surface of the portion of the front electrode exposed in the opening of the passivation film (the portion of the front electrode constituting the electrode pad), the Ni-deposited film having high solder wettability is provided apart from the sidewalls of the opening of the passivation film. The metal wiring is soldered to the Ni-deposited film on the front electrode. Further, the front electrode contains Al as a material and an entire area of the surface of the front electrode, excluding the portion where the Ni-deposited film is formed, is covered by the insulating film (the surface oxide film), which is formed by intentionally oxidizing the surface of the front electrode. The surface oxide film of the front electrode intervenes between the front electrode, the passivation film, and the sealant.

During soldering of the metal wiring, the wetting and spreading of the solder stops on the Ni-deposited film. Even when wetting and spreading of the solder spreads from on the Ni-deposited film in a direction to the passivation film, the surface oxide film of the front electrode is exposed between the Ni-deposited film and the sidewalls of the opening of the passivation film and thus, the solder layer is formed only on the Ni-deposited film, whereby unlike the conventional structure (refer to FIG. 19), the triple contact point (location where the passivation film, the plated film, and the solder layer contact one another at a single point) where stress locally concentrates at the surface of the front electrode due to power cycling of the semiconductor device is not formed. Accordingly, the power cycling capability may be enhanced.

Further, due to the surface oxide film of the front electrode, the adhesiveness between the passivation film and the sealant is increased. Thus, even when the curing temperature of the passivation film cannot be sufficiently raised, peeling of the passivation film may be suppressed. Further, corrosion of the front electrode may be suppressed by the surface oxide film of the front electrode and thus, peeling of the sealant may be suppressed. As described, locations (peeling locations of the passivation film and the sealant) where stress locally concentrates due to the power cycling of the semiconductor device are less likely to occur. Accordingly, the power cycling capability may be enhanced.

Figure 12:
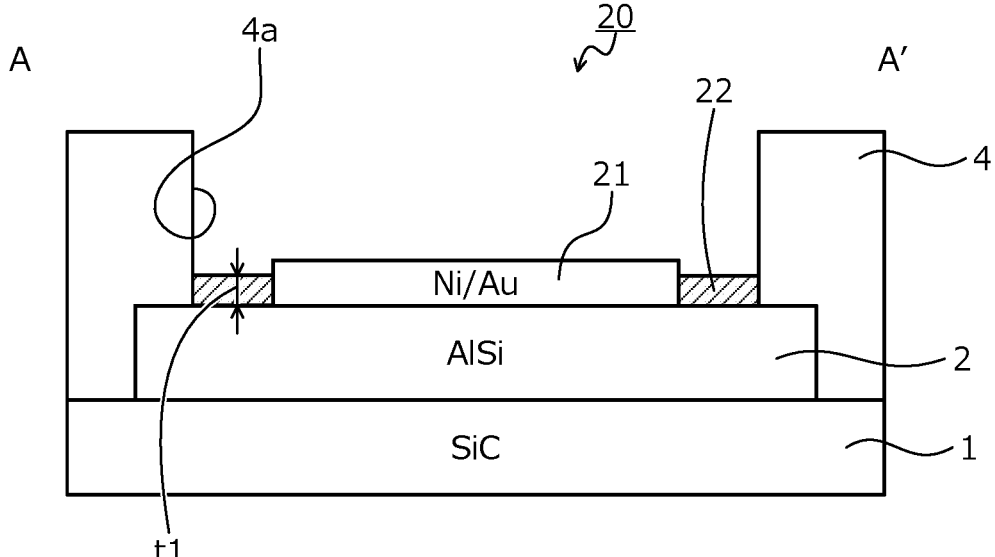
FIG. 12 is a cross-sectional view depicting the structure of the semiconductor device according to the second embodiment.

A method of manufacturing a semiconductor device according to a second embodiment is described. A layout when the semiconductor device according to the second embodiment is viewed from the front side of the semiconductor substrate thereof is the same as that of the first embodiment (refer to FIG. 1). FIG. 12 is a cross-sectional view depicting the structure of the semiconductor device according to the second embodiment. FIG. 12 depicts the structure along cutting line A-A' in FIG. 1. FIGS. 13, 14, 15, 16, and 17 are cross-sectional views depicting states of the semiconductor device according to the second embodiment during manufacture. A state in which the metal wiring is soldered to the front electrode 2 of a semiconductor device 20 according to the second embodiment is similar to a state in which the Ni-deposited film 3 and the surface oxide film 5 in FIG. 3 are replaced with a plated film 21 and a surface oxide film 22 in FIG. 12.

A method of manufacturing the semiconductor device 20 according to the second embodiment depicted in FIG. 12 differs from the method of manufacturing the semiconductor device 10 according to the first embodiment (refer to FIGS. 1 and 2) in that instead of the Ni-deposited film 3 formed by sputtering, the plated film (metal film) 21, such as an Ni plated film is formed by a plating treatment. Similar to the Ni-deposited film 3 of the first embodiment, the plated film 21 is disposed on the front electrode 2 in the opening 4a of the passivation film 4, apart from the sidewalls of the opening 4a of the passivation film 4. The plated film 21, for example, is a stacked film in which an Ni plated film and an Au-plated film are sequentially stacked in order state herein (indicated as "Ni/Au" in FIGS. 12, 16, and 17).

The metal wiring is bonded to the surface of the plated film 21 via the solder layer 6. The solder wettability of the surface of the front electrode 2 is enhanced by the plated film 21, whereby the solder joint performance of the metal wiring with respect to the front electrode 2 is enhanced. The plated film 21 is disposed apart from the sidewalls of the opening 4a of the passivation film 4, whereby the solder layer 6 is formed only on the plated film 21, and the solder layer 6 and the passivation film 4 are apart from each other. The surface oxide film 22 (hatched portion), which is formed by intentionally oxidizing the surface of the front electrode 2, is provided in a region (second formation region) between the plated film 21 and the passivation film 4. The surface oxide film 22 may be omitted between the front electrode 2 and the passivation film 4. That is, on the front electrode 2, the second formation region where the plated film 21 is formed in the second embodiment is different from the second formation region where the surface oxide film 5 is formed in the first embodiment.

Figure 13:
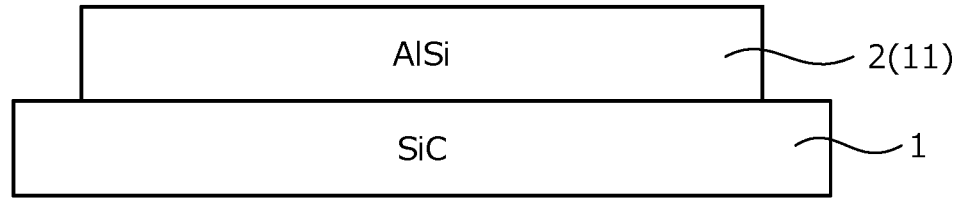
FIG. 13 is a cross-sectional view depicting a state of the semiconductor device according to a second embodiment during manufacture.
Figure 14:
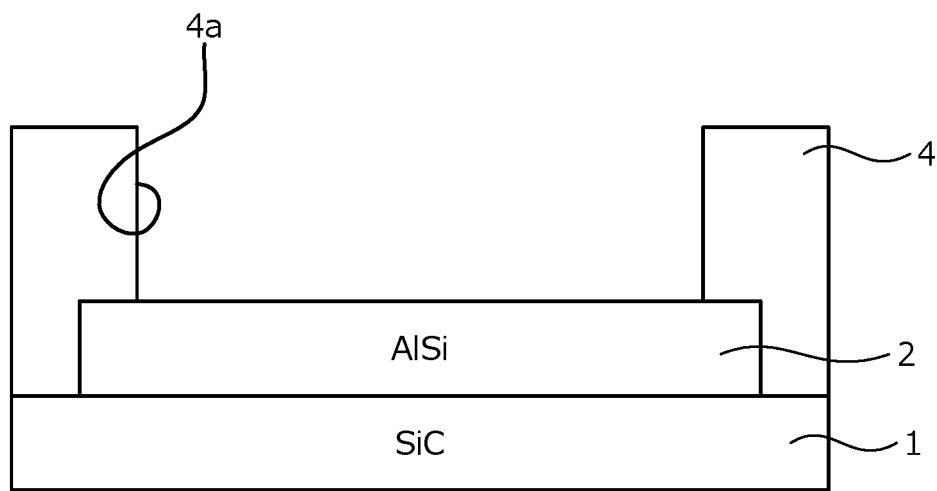
FIG. 14 is a cross-sectional view depicting a state of the semiconductor device according to the second embodiment during manufacture.

In particular, first, similar to the first embodiment, formation of a predetermined device structure (not depicted) (the first process) and formation of the Al-alloy-deposited film 11 constituting the front electrode 2 (the second process) are sequentially performed (refer to FIG. 4). Next, as depicted in FIG. 13, by a general method, the Al-alloy-deposited film 11 is selectively removed by etching (patterned), leaving only a portion of the Al-alloy-deposited film 11 constituting the front electrode 2. Next, as depicted in FIG. 14, subsequently, by a general method, the passivation film 4 is formed in an entire area of the front surface of the semiconductor substrate 1, the opening 4a is formed in the passivation film 4, and the portion of the front electrode 2 constituting the electrode pad is exposed (third and fourth processes).

Subsequently, a heat treatment for hardening (curing) the passivation film 4 is performed. The passivation film 4 may be cured in stages (stepped curing). The curing temperature (post-curing temperature of a post-treatment in an instance of stepped curing) of the passivation film 4 is, for example, 250 degrees C. or higher. In an instance in which the plated film 21 is formed after curing of the passivation film 4 (after the post-curing in the instance of stepped curing), the curing temperature of the passivation film 4 (the post-curing temperature in the instance of stepped curing) may be increased sufficiently, for example, to about 380 degrees C.

Figure 15:
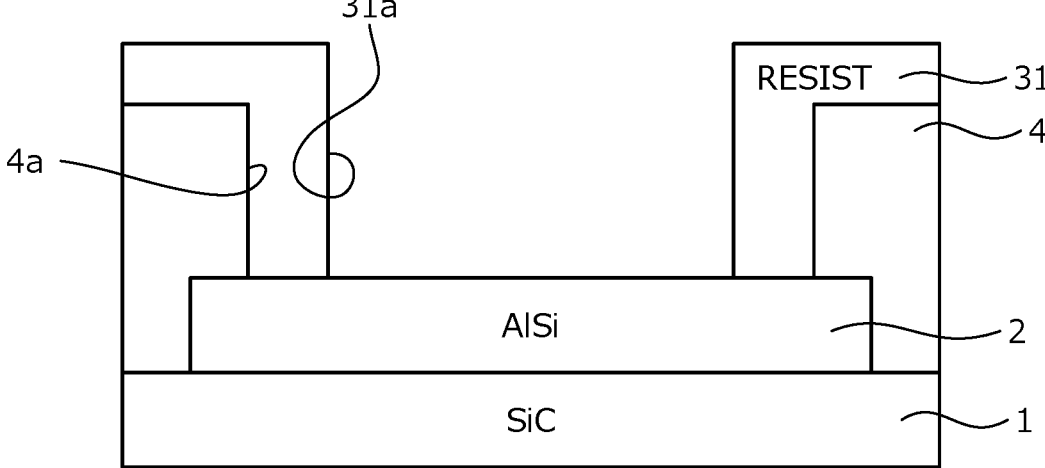
FIG. 15 is a cross-sectional view depicting a state of the semiconductor device according to the second embodiment during manufacture.

Next, as depicted in FIG. 15, a resist mask (resist film) 31 having an opening at a formation region of the plated film 21 is formed at the front surface of the semiconductor substrate (the fifth process). The resist mask 3 covers a formation region of the surface oxide film 22 and is in contact with entire surfaces of the sidewalls of the opening 4a of the passivation film 4. The resist mask 31 may cover the passivation film 4. The exposed area of the portion of the front electrode 2 constituting the electrode pad is decreased by the resist mask 31. While the resist mask 31 may be formed before the curing of the passivation film 4, preferably, the resist mask 31 may be formed after the curing of the passivation film 4.

Figure 16:
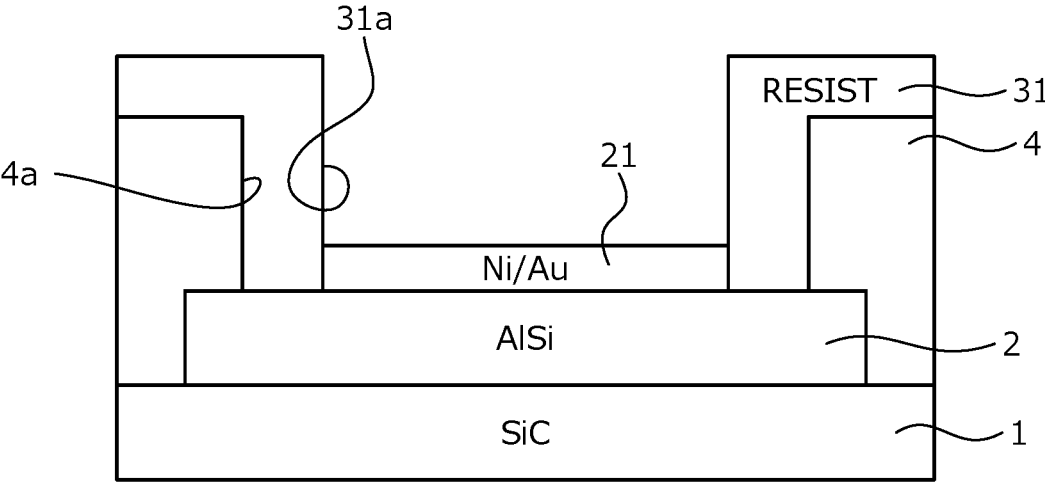
FIG. 16 is a cross-sectional view depicting a state of the semiconductor device according to the second embodiment during manufacture.

Next, as depicted in FIG. 16, the Ni plated film and the Au-plated film are sequentially formed as the plated film 21 by a general plating treatment (fifth process). The plated film 21 is formed only on the exposed surface of the front electrode 2 (i.e., a portion of the front electrode 2 exposed in an opening 31a of the resist mask 31). The Au film (Au-plated film) is formed by the plating treatment, whereby heavy metal contamination of the semiconductor substrate 1 may be prevented. Thus, the uppermost surface of the metal film for enhancing solder joint performance of the metal wiring with respect to the front electrode 2 may be set as the Au film (Au-plated film), which has high solder wettability and corrosion resistance.

Figure 17:
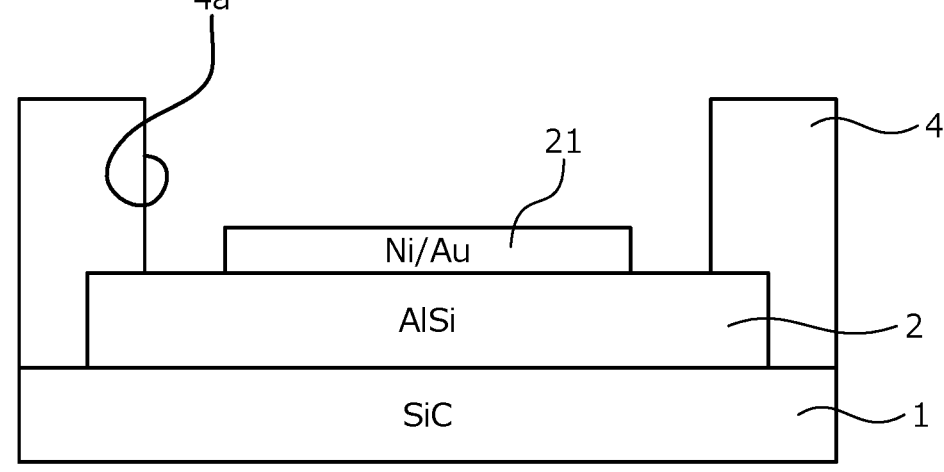
FIG. 17 is a cross-sectional view depicting a state of the semiconductor device according to the second embodiment during manufacture.

Subsequently, as depicted in FIG. 17, the resist mask 31 is removed (fifth process). As a result, a gap occurs between the plated film 21 and the sidewalls of the opening 4a of the passivation film 4 and is about a width of the resist mask 31 (resist thickness from sidewalls of the opening 31a of the resist mask 31 to the sidewalls of the opening 4a of the passivation film 4), and the front electrode 2 is exposed in the gap. Instead of the formation of the resist mask 31, the front electrode 2 may be exposed between the plated film 21 and the sidewalls of the opening 4a of the passivation film 4 using heat shrinkage of the passivation film 4 by curing at a high temperature (for example, about 250 degrees or higher). In this instance, for example, stepped curing of the passivation film 4 suffices to be performed as described herein.

In an instance in which heat shrinkage of the passivation film 4 by curing at a high temperature, for example, after precuring (temporary curing), which is a pretreatment of the passivation film 4 in which the opening 4a is formed, the plated film 21 is formed in an entire area of the surface of the front electrode 2 exposed in the opening 4a of the passivation film 4. Thereafter, post-curing at a high temperature heat shrinks the passivation film 4, whereby the passivation film 4 retracks in a direction away from the plated film 21. As a result, the gap between the plated film 21 and the sidewalls of the opening 4a of the passivation film 4 occurs, and the front electrode 2 is exposed in the gap. In this instance, to prevent the occurrence of cracking in the plated film 21, preferably, the post-curing temperature of the passivation film 4 may be, for example, about 300 degrees C. or less.

Next, the exposed surface of the front electrode 2 is oxidized using the plated film 21 and the passivation film 4 as a mask (sixth process). Oxidation treatment conditions for forming the surface oxide film 22 are the same as the oxidation treatment conditions for forming the surface oxide film 5 of the first embodiment. As a result, between the plated film 21 and the passivation film 4, the surface oxide film 22 is formed by self-alignment in an entire area of the surface of the front electrode 2. The uppermost surface of the plated film 21 is the Au-plated film and thus, the plated film 21 is not oxidized. By the processes up to here, the semiconductor device 20 depicted in FIG. 12 is completed. Thereafter, similar to the first embodiment, a general module assembly process is performed, whereby similar to the first embodiment, the semiconductor module is completed.

As described above, according to the second embodiment, even in an instance of using a plating treatment to form the metal film that enhances solder wettability of the surface of the front electrode, between the Ni-deposited film and the sidewalls of the opening of the passivation film, the surface of the front electrode is covered by the insulating film (the surface oxide film) and thus, effects similar to those of the first embodiment may be obtained.

Figure 18:
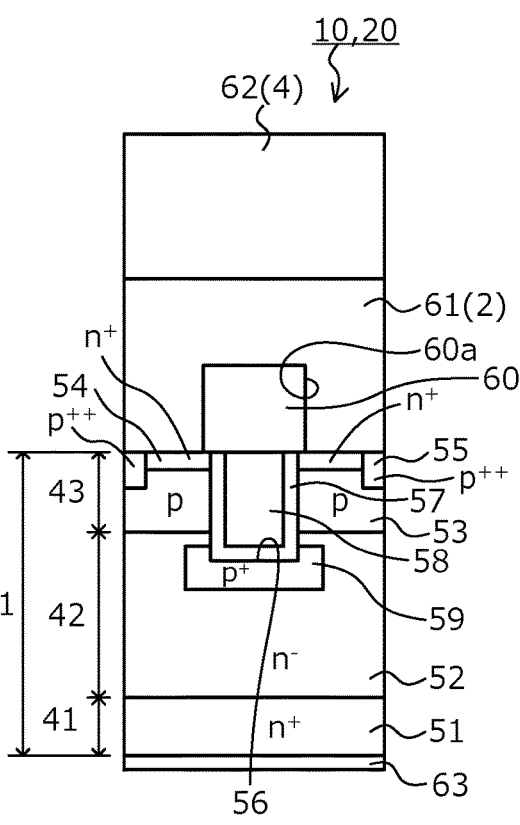
FIG. 18 is a cross-sectional view depicting the structure of the semiconductor device according to the third embodiment.

As a semiconductor device according to a third embodiment, the structure of a semiconductor device fabricated (manufactured) by applying the method of manufacturing the semiconductor device according to the first and second embodiments is described. Thus, an overall layout when the semiconductor device according to the third embodiment (hereinafter, the semiconductor device 10, 20) is viewed from the front surface of the semiconductor substrate 1 thereof is depicted in FIG. 1. FIG. 18 is a cross-sectional view depicting the structure of the semiconductor device according to the third embodiment.

FIG. 18 depicts a single unit cell covered by the passivation film 4, among multiple unit cells (functional units of the device) each having the same structure and disposed adjacent to one another in the active region. In other words, the uppermost surface of a unit cell covered by the passivation film 4 is the passivation film 4 and the uppermost surface of a unit cell disposed in the opening 4a of the passivation film 4 (refer to FIGS. 2 and 12) is the Ni-deposited film 3 of the first embodiment (or the plated film 21 of the second embodiment) or the surface oxide film 5.

The semiconductor device 10, 20 according to the third embodiment depicted in FIG. 18 is a vertical MOS field effect transistor (MOSFET) having gates in a trench gate structure (corresponds to the predetermined device structure to which the front electrode 2 of the first and second embodiments is electrically connected) in the semiconductor substrate 1 at the front surface thereof, in the active region.

The semiconductor substrate 1 is formed by sequentially forming by epitaxially growth on a front surface of an n⁺-type starting substrate 41 containing silicon carbide, epitaxial layers 42, 43 that constitute an n⁻-type drift region 52 and a p-type base region 53. The semiconductor substrate 1 has, as the front surface, a main surface having the p-type epitaxial layer 43 and has, as a back surface, a main surface having the n⁺-type starting substrate 41. The n⁺-type starting substrate 41 constitutes an n⁺-type drain region 51.

In the active region, in the semiconductor substrate 1 at the front surface thereof, MOS gates of the trench gate structure configured by the p-type base region 53, n⁺-type source regions 54, p⁺⁺-type contact regions 55, gate trenches 56, gate insulating films 57, and gate electrodes 58 are provided. The p-type base region 53 is a portion of the p-type epitaxial layer 43, excluding the n⁺-type source regions 54 and the p⁺⁺-type contact regions 55.

The n⁺-type source regions 54 and the p⁺⁺-type contact regions 55 are diffused regions formed in the p-type epitaxial layer 43 by ion implantation. The n⁺-type source regions 54 and the p⁺⁺-type contact regions 55 are selectively provided between the front surface of the semiconductor substrate 1 and the p-type base region 53 and are in contact with the p-type base region 53, and a source electrode 61 is in ohmic contact with the front surface of the semiconductor substrate 1.

The n⁺-type source regions 54 are in contact with the gate insulating films 57 at sidewalls of the gate trenches 56. The p⁺⁺-type contact regions 55 are disposed farther from the gate trenches 56 than are the n⁺-type source regions 54. The p⁺⁺-type contact regions 55 may be omitted. In an instance in which the p⁺⁺-type contact regions 55 are omitted, instead of the p⁺⁺-type contact regions 55, the p-type base region 53 reaches the front surface of the semiconductor substrate 1.

In the semiconductor substrate 1, the n⁻-type drift region 52 (n⁻-type epitaxial layer 42) is provided between the p-type base region 53 and the n⁺-type drain region 51 (the n⁺-type starting substrate 41) and is in contact with the n⁺-type drain region 51. The gate trenches 56 extend in a depth direction, from the front surface of the semiconductor substrate 1 and terminate in the n⁻-type epitaxial layer 42 via the n⁺-type source regions 54 and the p-type base region 53.

In the gate trenches 56, the gate electrodes 58 are provided via the gate insulating films 57. Between the p-type base region 53 and the n⁻-type drift region 52, an n-type current spreading region (not depicted) and p⁺-type regions 59 may be provided at deep positions closer to the n⁺-type drain region 51 than are bottoms of the gate trenches 56. The n-type current spreading region and the p⁺-type regions 59 are diffused regions formed in the n⁻-type epitaxial layer 42 by ion implantation.

The n-type current spreading region is a so-called current spreading layer (CSL) that reduces carrier spreading resistance. The n-type current spreading region is adjacent to the p⁺-type regions 59 and the gate trenches 56 and has an upper surface (surface facing the n⁺-type source regions 54) that is in contact with the p-type base region 53 and a lower surface (surface facing the n⁺-type drain region 51) that is in contact with the n⁻-type drift region 52.

The p⁺-type regions 59 are electrically connected to the source electrode 61 at a non-depicted portion, deplete when the MOSFET is off (or causes the n-type current spreading region to deplete, or both), and have a function of mitigating electric field applied to the gate insulating films 57 at the bottoms of the gate trenches 56. The p⁺-type regions 59 are provided apart from the p-type base region 53 and face the bottoms of the gate trenches 56 in the depth direction.

The p⁺-type regions 59 may be in contact with the gate insulating films 57 at the bottoms of the gate trenches 56 or may be apart from the gate trenches 56. Between the gate trenches 56 that are adjacent to one another (between the unit cells that are adjacent to one another), p⁺-type regions that are in contact with the p-type base region 53 and apart from the gate trenches 56 and the p⁺-type regions 59 may be provided at positions closer to the n⁺-type drain region 51 that are the bottoms of the gate trenches 56.

These p⁺-type regions between the gate trenches 56 also deplete when the MOSFET is off (or cause the n-type current spreading region to deplete, or both) and have a function of mitigating electric field applied to the gate insulating films 57 at the bottoms of the gate trenches 56. In an instance in which these p⁺-type regions, the p⁺-type regions 59, and the n-type current spreading region are provided, a portion of the n⁻-type epitaxial layer 42 excluding these regions constitutes the n⁻-type drift region 52.

An interlayer insulating film 60 is provided in substantially an entire area of the front surface of the semiconductor substrate 1 and covers all the gate electrodes 58. The n⁺-type source regions 54 and the p⁺⁺-type contact regions 55 are exposed in contact holes 60a of the interlayer insulating film 60. The source electrode 61 is in ohmic contact with the semiconductor substrate 1 via the contact holes 60a and is electrically connected to the n⁺-type source regions 54, the p⁺⁺-type contact regions 55, and the p-type base region 53.

The source electrode 61 corresponds to the front electrode 2 of the first and second embodiments. A gate pad 7 (refer to FIG. 1) is provided on the front surface of the semiconductor substrate 1 in the active region, via the interlayer insulating film 60. The gate pad 7 (refer to FIG. 1) is provided apart from the source electrode 61, at a same level as the source electrode 61. The gate electrodes 58 are electrically connected to the gate pad 7.

A passivation film 62 is a surface protecting film that protects the front surface of the semiconductor substrate 1 and covers substantially an entire area of the uppermost surface (i.e., the surfaces of the source electrode 61 and the interlayer insulating film 60) above the front surface of the semiconductor substrate 1. The passivation film 62 corresponds to the passivation film 4 of the first and second embodiments. A part of the source electrode 61 exposed in an opening (corresponds to the opening 4a of the first and second embodiments) of the passivation film 62 functions as a source pad (electrode pad).

In the portion of the source electrode 61 exposed in the opening of the passivation film 62, the Ni-deposited film 3 of the first embodiment (refer to FIG. 2) or the plated film 21 of the second embodiment is provided apart from the sidewalls of the opening of the passivation film 62. The surface of the source electrode 61, excluding the portion where the Ni-deposited film 3 (or the plated film 21) is formed, is covered by the surface oxide film 5 (refer to FIGS. 2 and 12), which is formed by intentionally oxidizing the surface of the source electrode 61.

The surface oxide film 5 is provided at the surface of the source electrode 61, at least between the passivation film 62 and the Ni-deposited film 3 (or the plated film 21). A drain electrode 63 is provided in an entire area of the back surface (back surface of the n$^+$-type starting substrate 41) of the semiconductor substrate 1. The drain electrode 63 is in ohmic contact with the back surface of the semiconductor substrate 1 and is electrically connected to the n$^+$-type drain region 51 (the n$^+$-type starting substrate 41).

As described above, according to the third embodiment, fabrication according to the method of manufacturing the semiconductor device according to the first and second embodiments is possible.

In the foregoing, the present invention is not limited to the embodiments described above and various modifications within a range not departing from the spirit of the invention are possible. For example, instead of the trench gate structure, a planar gate structure may be provided. Further, the present invention is similarly implemented when the conduction types (n-type, p-type) are reversed.

According to the present invention described above, when the metal wiring is soldered to the metal film on the electrode layer, the wetting and spreading of the solder is stopped on the metal film and thus, the solder layer is formed only on the metal film, whereby the protective film and the solder layer are not in contact with each other (are apart from each other). Thus, unlike the conventional structure (refer to FIG. 19), the triple contact point (location where the passivation film, the plated film, and the solder layer contact one another at a single point) that is a location where stress concentrates locally at the surface of the front electrode due to the power cycling of the semiconductor device is not formed.

The semiconductor device and the method of manufacturing a semiconductor device according to the present invention achieve an effect in that the power cycling capability may be enhanced.

As described above, the semiconductor device and the method of manufacturing a semiconductor device according to the present invention is useful for power semiconductor devices used in power converting equipment, power source devices of various types of industrial machines, etc. and are particularly suitable for semiconductor devices used under high-humidity environments.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate having a main surface;
a device structure provided in the semiconductor substrate, at the main surface of the semiconductor substrate;
an electrode layer containing aluminum, provided at the main surface of the semiconductor substrate, and electrically connected to the device structure;
a protective film provided above the main surface of the semiconductor substrate as an uppermost layer of the semiconductor device, the protective film covering the electrode layer and having an opening at a center thereof, a metal film to which a metal wiring is soldered, the metal film being provided at a surface of the electrode layer within the opening of the protective film so as to be apart from sidewalls of the opening of the protective film in a plan view of the semiconductor device; and
an aluminum oxide film provided at the surface of the electrode layer in an entire area of the electrode layer between the metal film and the sidewalls of the opening of the protective film.

2. The semiconductor device according to claim 1, wherein
the aluminum oxide film covers an entire area of the surface of the electrode layer, excluding an area where the metal film is provided, and
the protective film partially covers the aluminum oxide film.

3. The semiconductor device according to claim 1, wherein
the aluminum oxide film has a thickness that is greater than 10 nm but not more than 100 nm.

4. The semiconductor device according to claim 1, wherein
the metal film is a nickel film.

5. The semiconductor device according to claim 1, wherein
the metal film is a stacked film in which a nickel-plated film and a gold-plated film are stacked.

6. The semiconductor device according to claim 1, wherein
the semiconductor substrate contains silicon carbide.

7. A method of manufacturing the semiconductor device of claim 1, the method comprising:
as a first process, forming the device structure in the semiconductor substrate, at the main surface of the semiconductor substrate;
as a second process, forming the electrode layer containing aluminum and electrically connected to the device structure at the main surface of the semiconductor substrate;
as a third process, forming the protective film to cover the electrode layer above the main surface of the semiconductor substrate as the uppermost layer of the semiconductor device;
as a fourth process, forming in the protective film, the opening that exposes the electrode layer from the protective film;
as a fifth process, forming the metal film for the wiring layer to be soldered thereto, apart from the sidewalls of the opening of the protective film, at a first formation region of the electrode layer that is located within the opening of the protective film in a plan view of the semiconductor device on the electrode layer; and
as a sixth process, oxidizing a surface of the electrode layer to form the aluminum oxide film at the surface of the electrode layer in the entire area of the second formation region, the second formation region including a region of the surface of the electrode layer between the metal film and the sidewalls of the opening of the protective film.

8. The method according to claim 7, wherein
the fifth process and the sixth process are performed after the second process but before the third process,
the fifth process includes:
by performing sputtering, forming a nickel film on the electrode layer in an entire area of the surface of the electrode layer;

forming a resist film on the nickel film so as to cover the first formation region of the electrode layer; and etching the nickel film using the resist film as a mask and thereby leaving a portion of the nickel film constituting the metal film, and exposing from the nickel film an area of the surface of the electrode layer that surrounds a periphery of the metal film, the sixth process includes:

oxidizing the exposed surface of the electrode layer using the resist film as a mask to form the aluminum oxide film at the surface of the electrode layer in the entire area of the second formation region of the electrode layer, the second formation region being the entire surface of the electrode layer excluding the first formation region, and removing the resist film, and the third process includes forming the protective film to partially cover the aluminum oxide film.

9. The method according to claim 7, wherein the fifth process and the sixth process are performed after the fourth process, the fifth process includes:

forming on the electrode layer, a resist film having an opening at the first formation region of the electrode layer;

performing a plating treatment using the resist film as a mask and thereby sequentially stacking a nickel-plated film and a gold-plated film as the metal film; and removing the resist film, the sixth process includes removing the resist film and oxidizing the surface of the electrode layer to form the aluminum oxide film in an entire area of the second formation region, the second formation region surrounding a periphery of the metal film.

10. The method according to claim 7, wherein the sixth process includes forming the aluminum oxide film to have a thickness that is greater than 10 nm but not more than 100 nm.

11. The method according to claim 7, wherein the semiconductor substrate contains silicon carbide.

* * * * *